United States Patent
Huang et al.

(10) Patent No.: US 9,231,061 B2
(45) Date of Patent: Jan. 5, 2016

(54) FABRICATION OF SURFACE TEXTURES BY ION IMPLANTATION FOR ANTIREFLECTION OF SILICON CRYSTALS

(75) Inventors: Mengbing Huang, Schenectady, NY (US); Nirag Kadakia, San Antonio, TX (US); Sebastian Naczas, Albany, NY (US); Hassaram Bakhru, Loudonville, NY (US)

(73) Assignee: The Research Foundation of State University of New York, Albany, NY (US)

( * ) Notice: Subject to any disclaimer, the term of this patent is extended or adjusted under 35 U.S.C. 154(b) by 1064 days.

(21) Appl. No.: 13/279,884

(22) Filed: Oct. 24, 2011

(65) Prior Publication Data

US 2012/0097209 A1     Apr. 26, 2012

Related U.S. Application Data

(60) Provisional application No. 61/406,452, filed on Oct. 25, 2010.

(51) Int. Cl.
*H01L 31/18* (2006.01)
*H01L 31/0236* (2006.01)
*H01L 29/34* (2006.01)

(52) U.S. Cl.
CPC .......... *H01L 29/34* (2013.01); *H01L 31/02363* (2013.01); *Y02E 10/50* (2013.01)

(58) Field of Classification Search
CPC .......................... H01L 31/02363; H01L 29/34
USPC ............................................ 136/256; 438/71
See application file for complete search history.

(56) References Cited

U.S. PATENT DOCUMENTS

| | | | | |
|---|---|---|---|---|
| 5,756,391 A | * | 5/1998 | Tsuchiaki | H01L 21/312 257/E21.259 |
| 6,365,933 B1 | * | 4/2002 | Yamazaki | H01L 21/32055 257/347 |
| 6,492,682 B1 | * | 12/2002 | Akiyama et al. | 257/347 |
| 6,995,075 B1 | * | 2/2006 | Usenko | 438/458 |
| 7,816,239 B2 | | 10/2010 | Blake et al. | |
| 7,888,249 B2 | | 2/2011 | Bateman et al. | |
| 2002/0102764 A1 | * | 8/2002 | Yamazaki | C30B 1/023 438/69 |
| 2005/0093100 A1 | * | 5/2005 | Chen | H01L 21/76254 257/616 |
| 2006/0040469 A1 | * | 2/2006 | Aga | H01L 21/265 438/458 |
| 2009/0308439 A1 | | 12/2009 | Adibi et al. | |

(Continued)

OTHER PUBLICATIONS

Zhao et al.: 19.8% Efficient "Honeycomb" Textured Multicrystalline and 24.4% Monocrystalline Silicon Solar Cells, Applied Physics Letters, vol. 73, No. 14, pp. 1991-1993, (1998).

(Continued)

*Primary Examiner* — Golam Mowla
(74) *Attorney, Agent, or Firm* — Heslin, Rothenberg, Farley & Mesiti, P.C.

(57) ABSTRACT

The invention relates to a new method of texturing silicon surfaces suited for antireflection based on ion implantation of hydrogen and heavy ions or heavy elements combined with thermal annealing or thermal annealing and oxidation. The addition of the heavy ions or heavy elements allows for a more effective anti-reflective surface than is found when only hydrogen implantation is utilized. The methods used are also time- and cost-effective, as they can utilize already existing semiconductor ion implantation fabrication equipment and reduce the number of necessary steps. The antireflective surfaces are useful for silicon-based solar cells.

5 Claims, 8 Drawing Sheets

(56) References Cited

U.S. PATENT DOCUMENTS

| | | | |
|---|---|---|---|
| 2009/0308440 | A1 | 12/2009 | Adibi et al. |
| 2009/0308450 | A1 | 12/2009 | Adibi et al. |
| 2009/0309039 | A1 | 12/2009 | Adibi et al. |
| 2010/0041176 | A1 | 2/2010 | Sullivan et al. |
| 2010/0124799 | A1 | 5/2010 | Blake et al. |
| 2013/0298975 | A1* | 11/2013 | Yang et al. ............ 136/255 |

OTHER PUBLICATIONS

Kessels et al.: High-rate Deposition of a-SiNx:H for Photovoltaic Applications by the Expanding Thermal Plasma, J. Vac. Sci. Technol. A 20(5), pp. 1704-1715, (2002).

Chhajed et al.: Nanostructured Multilayer Graded-index Antireflection Coating for Si Solar Cells with Broadband and Omnidirectional Characteristics, Applied Physics Letters 93, 251108 (2008).

Sun et al.: Templated Fabrication of Large Area Subwavelength Antireflection Gratings on Silicon, Applied Physics Letters 91, 231105 (2007).

Sun et al.: Broadband Moth-Eye Antireflection Coatings on Silicon, Applied Physics Letters 92, 061112 (2008).

Shen et al.: High-Density Regular Arrays of Nanometer-Scale Rods Formed on Silicon Surfaces via Femtosecond Laser Irradiation in Water, Nano Letters, vol. 8, No. 7, pp. 2087-2091 (2008).

Goetzberger et al.: Solar Cells: Past, Present Future, Solar Energy Materials & Solar Cells 74, pp. 1-11, (2002).

Bergmann et al.: The Future of Crystalline Silicon Films on Foreign Substrates, Thin Solid Films 403-404, pp. 162-169, (2002).

B. Terreault: Hydrogen Blistering of Silicon Progress in Fundamental Understanding, Phys. Stat. Sol. (a) 204, No. 7, 2129-2184 (2007).

Hochbauer et al.: The Influence of Boron Ion Implantation on Hydrogen Blister Formation in n-Type Silicon, Journal of Applied Physics, vol. 86, No. 8, pp. 4176-4183, (1999).

Duo et al.: Evolution of Hydrogen and Helium Co-Implanted Single-Crystal Silicon During Annealing, Journal of Applied Physics, vol. 90, No. 8, pp. 3780-3786, (2001).

Van de Walle et al.: Energetics of Bond-Centered Hydrogen in Strained Si—Si bonds, Physical Review B, vol. 51, No. 4, pp. 2636-2639, (1995).

Hochbauer et al.: Physical Mechanisms Behind the Ion-Cut in Hydrogen Implanted Silicon, Journal of Applied Physics, 92, 2335 (2002).

C.A. Volkert: Stress and Plastic Flow in Silicon During Amorphization by Ion Bombardment, Journal of Applied Physics, 70, 3521 (1991).

\* cited by examiner

FABRICATION OF SURFACE TEXTURES BY ION IMPLANTATION FOR ANTIREFLECTION OF SILICON CRYSTALS

CROSS-REFERENCE TO RELATED APPLICATIONS

This application claims priority under 35 U.S.C. §119 to U.S. Provisional Application No. 60/406,452, filed Oct. 25, 2010, which is herein incorporated by reference in its entirety.

BACKGROUND OF THE INVENTION

1. Technical Field

The present invention generally relates to textured crystalline silicon surfaces and methods of producing them. More particularly, the present invention relates to textured crystalline solar cells and methods of their fabrication.

2. Background Information

A critical step toward an enhanced efficiency in sunlight-to-electricity conversion through photovoltaic action is to minimize the reflection of sunlight from the surface of solar devices. This is of particular importance for solar cells based on silicon [Si] crystals, the dominant material in today's photovoltaic market. Si has a high refractive index, causing the reflection of more than 35% of infrared-to-ultraviolet light from a polished Si surface. There are two major approaches to achieving antireflection of Si solar cells. Most commercial cells are coated with quarter-wavelength thin films, but these quarter-wavelength thin film stacks reduce light reflection only for a narrow range of wavelengths and incident angles. Better performance has been achieved with a higher level of sophistication in thin film deposition and materials processing, as exemplified by a multilayer graded-index antireflection coating. A generally less sophisticated method for enhancing light trapping in solar cells relies on the formation of textured surface structures. Anisotropic wet chemical etching to form pyramids in crystalline silicon is a commonly used method for surface texturing, but it cannot be extended for thin film solar cells due to large dimensions of the created textures. Recent work has shown that the creation of surface structure arrays in the form of inverted pyramids or protruding columns, with sizes comparable of sunlight wavelengths and depths of a few microns, can result in a low reflectivity (<5%) over a broad spectral range. However, the fabrication of such surface texture structures requires multiple materials processing steps involving lithography, masking, thin film deposition and anisotropic etching of Si with chemical solutions, reactive ions and even femtosecond lasers, which are neither adequate for large-volume production nor economically viable.

The high production cost and the low manufacturing capacity in the fabrication of Si solar cells remain the obstacle to their terrestrial applications. Thus, a need exists for a cost-effective method of increasing the efficiency of solar devices.

SUMMARY OF THE INVENTION

The invention relates, in some embodiments, to a method based on ion implantation and thermal annealing to fabricate silicon [Si] surface textures for antireflection purposes. A potential solution to the challenges described above is to capitalize on the tools and methods developed from the semiconductor industry for Si photovoltaics production. As demonstrated herein, ion implantation, a well-established technique in Si microelectronics fabrication, can be used to fabricate surface texture structures suitable for antireflection applications in Si photovoltaics. Modification to crystalline Si surfaces by hydrogen [H] ion implantation is a well known phenomenon, but the surface structures generated by H implantation alone, typically of a low packing density and small aspect ratio, are not effective in suppressing light reflection from Si. Previous investigations have shown a strong effect of co-implantation of other light ion species such as helium [He] or boron [B] on the surface blistering in hydrogen-implanted Si, but the role of co-implantation of heavy ions (e.g., noble gases, such as, argon [Ar], krypton [Kr], xenon [Xe], or a metalloid, such as germanium [Ge] or silicon [Si]) in the formation of Si surface structures has rarely been studied. Co-implantation of hydrogen and argon, for instance, combined with thermal annealing and oxidation, can result in an interesting surface morphology in Si crystals, yielding the lowest light reflectance about 1% over a broad spectral range at various light incident angles. These textured crystalline silicon surfaces and fabrication techniques, therefore, are ideal for solar cells, devices, photovoltaic devices and photovoltaic arrays.

In a first aspect, a method for producing a textured crystalline silicon surface is provided. In this method, a crystalline silicon substrate is provided. The crystalline silicon substrate is implanted with hydrogen ions by ion implantation. The crystalline silicon substrate is also implanted with argon, krypton, xenon, silicon or germanium ions by ion implantation. For purposes of the invention, the hydrogen ions and heavy ions may be implanted in either sequence (i.e., in some embodiments, the hydrogen ions are implanted first; in other embodiments, the heavy ions may be implanted before the hydrogen ion implantation). The implanted silicon is then annealed. Lattice damage to crystalline Si generated by ion implantation is reduced or completely removed by annealing. In some embodiments of the invention, the annealing occurs at a temperature between 800° C. and 1200° C., inclusive. The annealing may occur at a temperature between and including 1050° C. and 1150° C.

The present invention provides, in a second aspect, a textured crystalline silicon surface. This textured crystalline silicon surface is obtainable by the process of providing a crystalline silicon substrate, then implanting the silicon substrate with hydrogen ions and separately with heavy ions by ion implantation. The implanted silicon is then annealed.

In a third aspect, the present invention provides a device comprising a crystalline silicon substrate. The surface of this substrate includes a means for preventing the reflection of at least 90% light at wavelengths between and including 400 and 900 nm. In some embodiments, at least 95% of the light reflection is prevented.

In a fourth aspect, a photovoltaic device comprising the textured crystalline silicon surface described herein is provided.

In a fifth aspect, a photovoltaic array comprising at least one photovoltaic device described herein is provided.

Aspects of the invention may be fully compatible with current Si semiconductor technologies, offering a viable solution to large-volume and low-cost production of Si photovoltaic devices.

These and other objects, features and advantages of this invention will become apparent from the following detailed description of the various aspects of the invention taken in conjunction with the accompanying drawings.

DETAILED DESCRIPTION OF THE INVENTION

In a first aspect, the invention relates to a method for producing a textured crystalline silicon surface. A crystalline silicon substrate is provided. The crystalline silicon substrate can be single crystalline, polycrystalline or multicrystalline. These silicon substrates are especially suitable for use in solar cells. The crystalline silicon substrate can be a layer of silicon alone. In addition, the substrate may also be a silicon thin film, as in a silicon-on-insulator. The substrate may also be a polycrystalline silicon thin film of various grain size prepared on a separate substrate. In some instances, the crystalline silicon substrate may also be of either p- or n-type doping. A solar-grade silicon material could contain many impurity atoms, such as oxygen, carbon, and transition metals. These so-called p-type (e.g., boron) or n-type (e.g., phosphorus) are introduced intentionally in silicon solar cell fabrication, and they are needed to form a p-n junction for collecting electrical currents induced by the sunlight.

Figure 1:
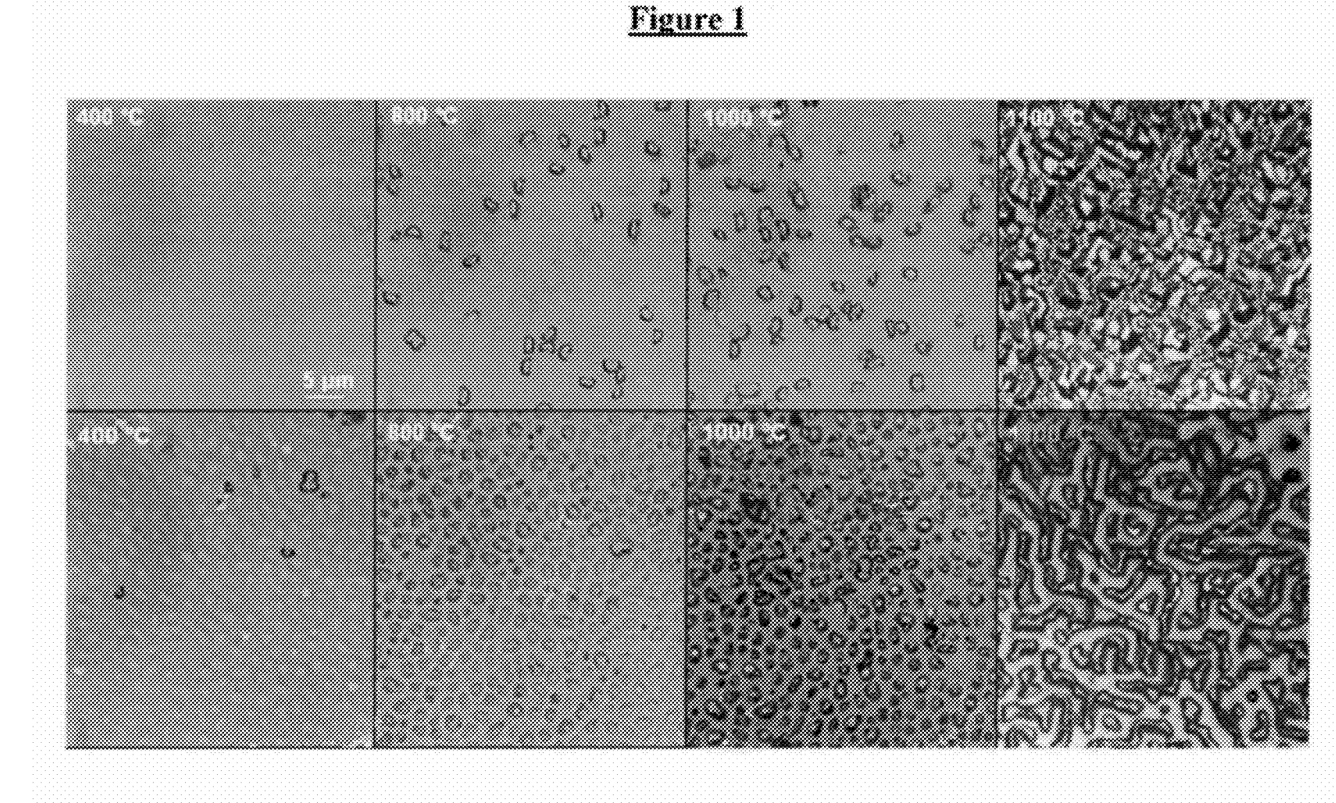
FIG. 1 depicts optical microscope images of Si surfaces for the H-implanted samples (top panels) and the H and Ar co-implanted samples (bottom panels) at varying annealing temperatures.

The crystalline silicon substrate is implanted with hydrogen ions. While not being bound to any one theory, it is believed that exfoliation of silicon [Si] crystals is induced by hydrogen [H] ion implantation. With a large H concentration present in Si, H platelets are formed and act as the nucleation sites for the generation of gaseous $H_2$ during thermal annealing, resulting in cracking or removal of Si materials as a result of an internal pressure buildup. The top panels of FIG. 1 show the evolution of surface morphologies with increasing annealing temperatures for a Si (100) crystal (n-type, 10-20 Ω-cm) implanted with 20 keV H ions to a fluence of $8.7 \times 10^{16}/cm^2$. Following post-H-implantation annealing, micron-size "blisters" or cavities appear on the Si surface and some or many of the blisters "pop off" or rupture into craters at high annealing temperatures. At 1100° C. (for 75 minutes), a significant exfoliation of Si occurs, yielding micron-size hillock-like structures sparsely distributed on the surface. Atomic force microscopy (AFM) reveals that the height of these hillock structures is about 200 nanometers [nm], suggesting that Si delamination occurs at a depth shallower than the H concentration peak location (about 270 nm below the surface). Compared to an unprocessed Si surface, the light reflection from such textured Si surfaces decreases but remains above about 20%. Apparently, both the density and the aspect ratio of these surface textures are too low to be effective in suppressing light reflection.

Figure 2:
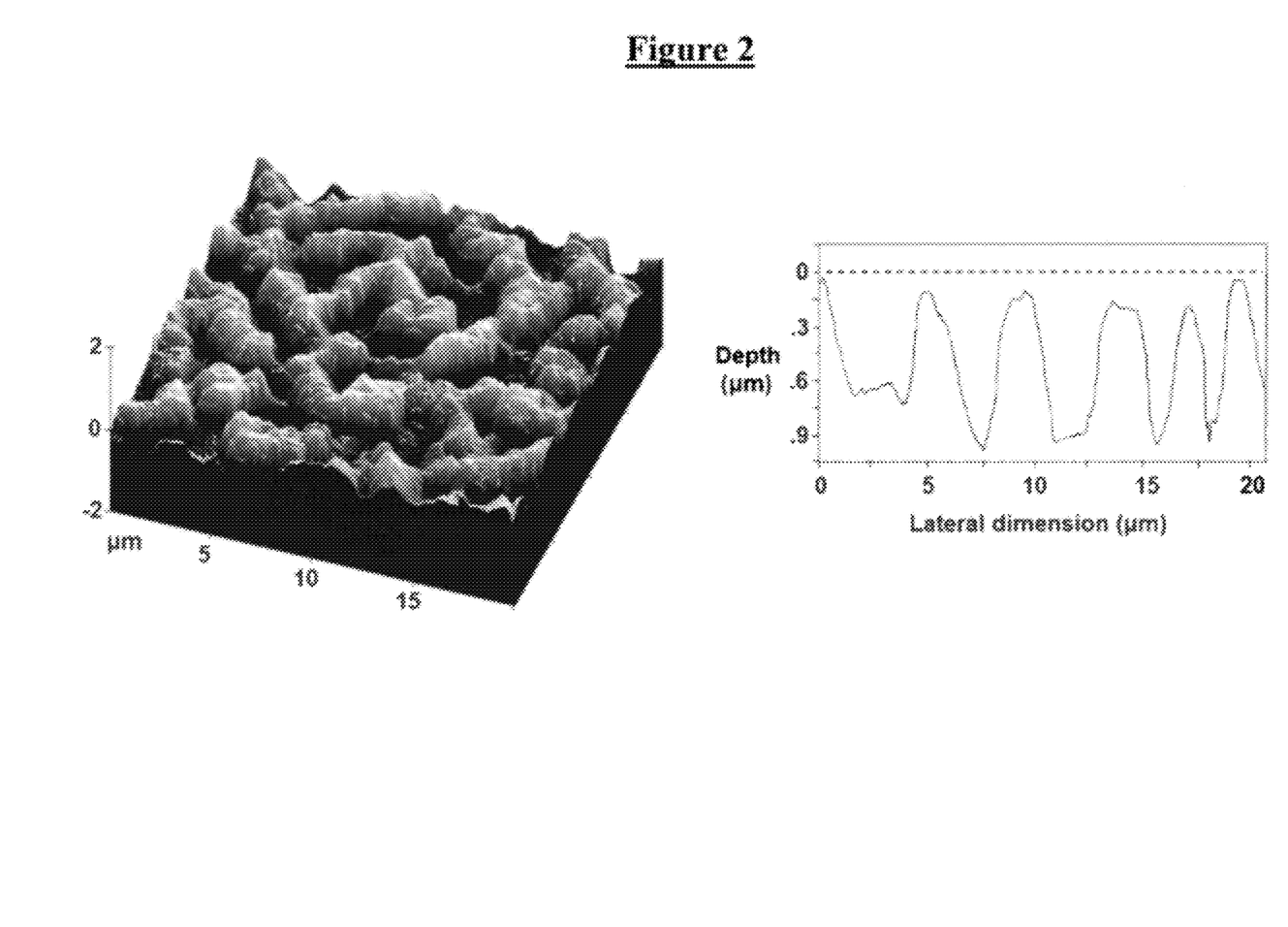
FIG. 2 shows AFM measurements of the H and Ar co-implanted sample following annealing at 1100° C. for 75 minutes. Left: 3-d image of surface morphology. Right: Line trace of surface structures.

In some embodiments of the invention, any heavy ion (e.g., a noble gas, such as argon [Ar], krypton [Kr] or xenon [Xe], or a metalloid, such as germanium [Ge] or silicon [Si]) can be used for co-implantation. In one embodiment of the invention, following H implantation, the silicon substrate is further implanted with Ar ions (for example, 90 keV, for a projected range about 100 nm) to a fluence, for example, of $5.5 \times 10^{15}/cm^2$ at, for example, room temperature. These samples exhibit an increased density and smaller size of surface blisters (FIG. 1, bottom panels) as compared to the case with the H implant only (FIG. 1, top panels). Surface blisters appear even at an annealing temperature as low as 400° C. and the blisters start to pop off or rupture only when the annealing temperature is above about 800° C. In particular, an entirely different surface morphology forms at about 1100° C., which is characterized by interconnected structures comprised of trenches and of ridges of up to approximately 1 micrometer [μm] in depth (that is, the distance between the top of said ridges and the bottom of said trenches) and approximately 1-2 μm in width (FIG. 2). Note that the ion cut occurs at a location much deeper than the H concentration distribution. The distance between the top of the ridges and the bottom of the trenches, as well as the resultant aspect ratio, can be tailored by varying the energies of hydrogen and argon ions.

Figure 8:
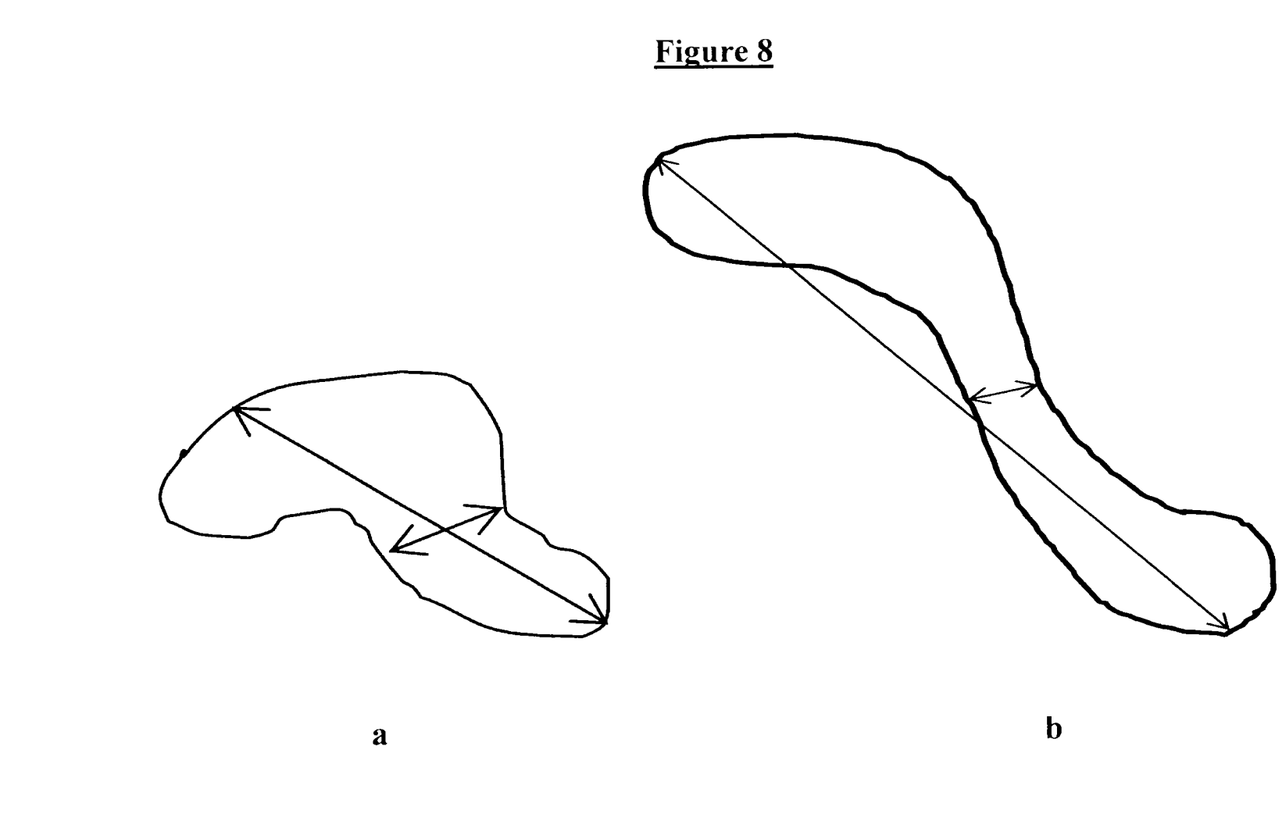
FIG. 8 illustrates examples of the term "aspect ratio" as used in this disclosure.

Both the density and aspect ratio are much higher for the co-implanted surface textures than they are for the surface textures generated by a single H implant. The aspect ratio of the majority of these ridges is greater than 5:1. The aspect ratio is defined as the ratio between the largest cross-section of a ridge and the smallest cross-section of the same ridge, with the cross-section measurements being taken parallel to the silicon substrate (i.e., akin to the length and width, but not the depth, of the ridge). The cross-section is taken at half-height. This is illustrated in FIGS. 8a and 8b. A sphere, no matter its dimensions, by definition has an aspect ratio of 1 (because all cross-section measurements are the same). When considering surface topography, in which measurement is parallel to the surface (as it is in the present case), a circular disk as a surface feature would have an aspect ratio of 1. A ridge of the invention, on the other hand, could have a very large aspect ratio if the smallest cross-section (its "width") is much smaller than its largest cross-section (its "length").

The ridges of the invention may have any shape that allows the aspect ratio of the majority of the ridges to be greater than 5:1. The variety of shapes that may be encompassed by this aspect ratio is evidenced in the last (right-most) optical microscope image on the bottom panel of FIG. 1.

Figure 3:
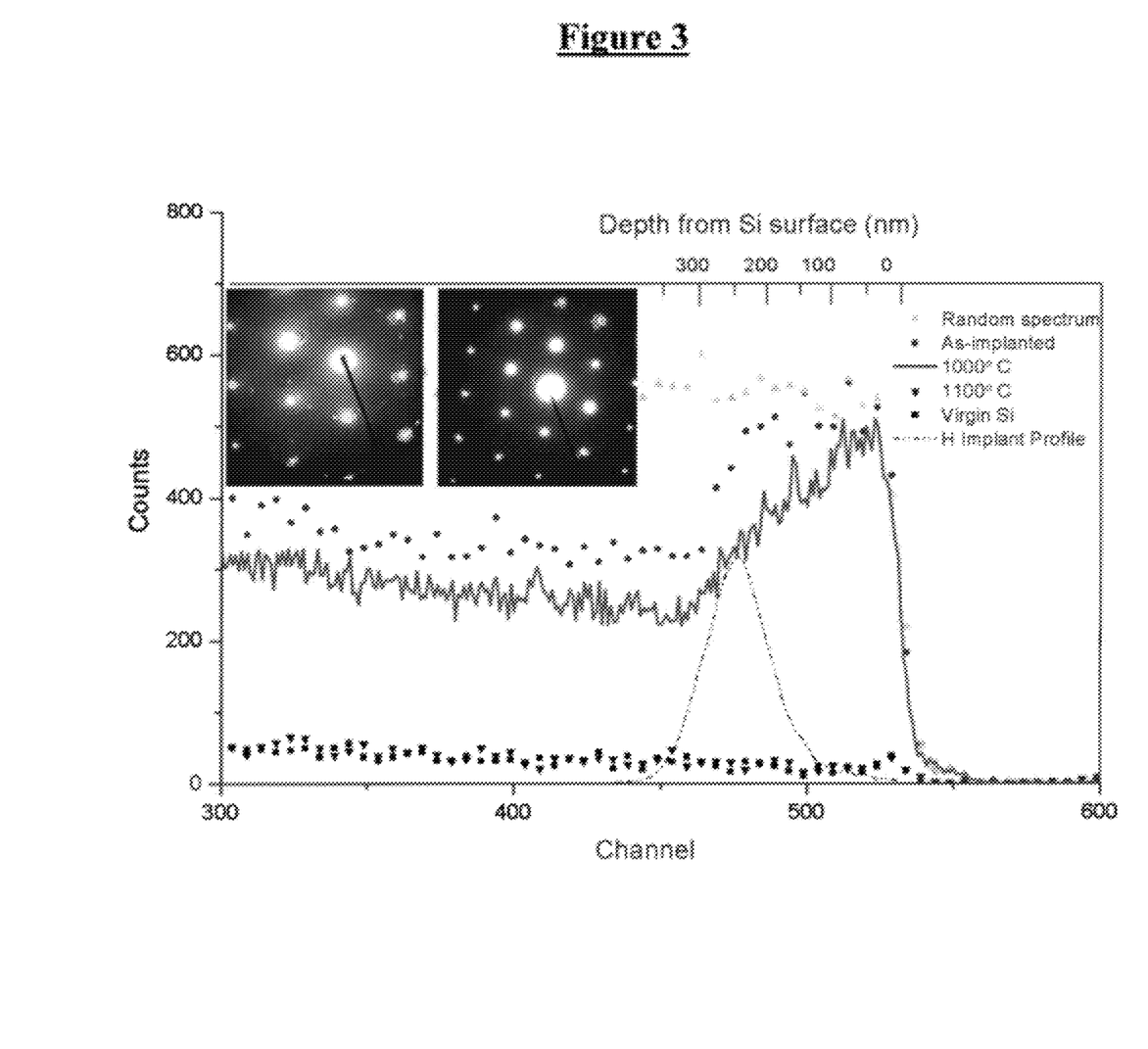
FIG. 3 illustrates RBS/ion channeling and TEM analysis of the H and Ar co-implanted sample. Left TEM image: 1000° C. anneal; Right TEM image: 1100° C. anneal. The graph depicts the recrystallization of an amorphized silicon sample at different temperatures over a 75-minute annealing time. The dashed line represents the depth distribution of implanted H ions measured by NRA.

In some embodiments of the invention, the ion implantation is conducted under conditions such that the depth of implantation from the silicon surface for argon ions is less than or equal to half of that for hydrogen ions. In some embodiments, the depth of implantation of hydrogen ions has a concentration peak between 230 nm and 500 nm from the surface. In some embodiments, the depth of implantation of hydrogen ions has a concentration peak between 250 nm and 370 nm from the surface. In some embodiments, the depth of implantation of hydrogen ions has a concentration peak of approximately 270 nm from the surface (±5 nm). In some embodiments, the concentration of implanted Ar peaks between around 75 nm to around 200 nm from the surface. In some embodiments, the concentration of implanted Ar peaks between 90 nm to 150 nm from the surface. In certain embodiments, the concentration of implanted Ar peaks at 100 nm from the surface (±5 nm). However, the Ar implantation can yield an amorphous layer extending from the surface to a depth of about 300 nm, close to the peak distribution of implanted H ions, as shown in FIG. 3 with Rutherford backscattering/ion channeling (RBS/C) and nuclear reaction analysis (NRA). Crystal regrowth of the amorphous Si (a-Si) via solid phase epitaxy (SPE) processes occurs as the samples are annealed. Following annealing at 1100° C. for 75 minutes, the Si crystal quality is completely recovered to that of the virgin Si. This is also confirmed by transmission electron microscopy (TEM) measurements, as evidenced by the vanishing of the ring-shape patterns of electron diffraction which are characteristic of a polycrystalline structure (FIG. 3). The SPE regrowth of these a-Si samples is much slower than that typically reported for a-Si, presumably due to a large concentration of H, whose presence is known to significantly retard the regrowth of a-Si.

By varying the energy and fluence for Ar ions, different a-Si layers with thickness either much less than or larger than 300 nm (the H concentration peaking about 270 nm) may be produced, but these Ar implants do not yield the desired surface textures as seen above. This is understandable, considering the shallow location for the maximum stress in the case of a very thin a-Si layer, or the trapping of atomic H by a variety of structural defects, which inhibits the growth of H platelets large enough for accumulation of molecular hydrogen, in the case of a very thick amorphous Si layer containing the entire profile of implanted H ions.

The formation of H platelets is believed to involve the incorporation of H atoms in certain positions of the Si lattice, e.g., the bond-center position, which costs energy due to the generation of strains. Consequently, H platelets are preferentially formed in the region with pre-existing stresses, e.g., out-of-plane tensile stresses resulting from implantation-produced vacancy and interstitial clusters.

The marked differences in surface morphology between the H-only implant and the H+Ar implant according to aspects of the invention may reflect differences in the density and distribution of defects created in these two situations. Without being held to any one theory, for the latter, there exist a large number of structural defects which could readily trap H atoms to form a high density of H platelets, leading to densely packed surface structures. In contrast, for the samples implanted with H only, the number of H platelets should be much smaller due to a less amount of defects available for H trapping, and consequently, each platelet is expected to contain more H atoms. This would not only enlarge their size at the inception of formation, but also facilitate a fast buildup of high pressures within Si during thermal annealing, resulting in a rapid expansion and even coalescence of several platelets/bubbles, and therefore the H-only implant produces the surface structures with a smaller density.

In the H and Ar co-implanted samples, according to aspects of the invention, exfoliation of Si may occur at a location much deeper than H concentration peak, as opposed to the general observation of ion cutting close to the H concentration peak location. This may be understood by considering the effects of crystal stresses on the formation of H platelets. In the case with the H implant only, the location of the maximum stress coincides with the peak distribution of lattice damage, being actually shallower than the peak concentration of implanted H ions in most cases. As the damage level increases, the location of the maximum stress could be shifted deep below the highly damaged region. The situation may become more dramatic if ion implantation creates an amorphous silicon ("a-Si") layer, as in our case with Ar co-implantation. This a-Si layer is critical to the modification of stress distributions in the Si crystal, since plastic flow can occur in a-Si, causing the relaxation of strains, and thus a significant reduction of stresses in the implanted region. In certain embodiments of the invention utilizing Ar and H co-implantation, point defects produced by Ar implantation could out-diffuse from the implanted region and accumulate in the underlying crystalline Si, yielding the maximum stress at a location below the amorphous-crystalline Si interface. Upon annealing, H atoms would preferentially trap at this location, much deeper than the implanted H range (about 270 nm), resulting in Si eruption at a depth about 1 μm below the surface. In one aspect, then, an amorphous Si layer with optimal thickness may be produced to shift the location of the maximum stress well beyond the projected range of implanted H ions in Si.

Annealing, for purposes of this invention, involves the recrystallization of amorphous silicon. FIG. 3 demonstrates the effect of annealing temperature on the recrystallization of silicon samples. The dashed line is the initial depth distribution of H ions before annealing. The symbols and the solid line are the RBS/channeling signals as a function of depths/channel numbers for different annealing temperatures. In these examples, each sample was exposed to a specific temperature for 75 minutes. The higher the intensity of the signal, the larger the degree of disorder/defect in the crystal. As seen in FIG. 3, following 1100° C. annealing, the RBS/channeling spectrum is nearly the same as the control (unprocessed) virgin Si, suggesting that this annealing condition has yielded excellent crystal quality, which would lead to a better performance of solar cells. The two pictures shown in the graph are taken using transmission electron microscope (TEM) and reflect the crystal structures of the silicon sample. The left TEM image was taken of a sample that underwent a 1000° C. anneal; the right TEM image is of an 1100° C. sample. In particular, the picture on the right shows a clear pattern of diffraction spots with no diffuse backgrounds, which is another indicator of an excellent crystal quality in the sample. This confirms the RBS/channeling results.

In some embodiments of the invention, annealing occurs at a temperature between and including 800° C. and 1200° C. In other embodiments, annealing occurs at a temperature between and including 1050° C. and 1150° C. In some embodiments, the annealing takes place for 60 to 90 minutes, inclusive. In other embodiments, the annealing takes place for about 75 minutes. For the purpose of the present invention, the recitation of "about 75 minutes" is not intended to be precise, but is meant to indicate that the sample is annealed for approximately 75 minutes, which encompasses 72-78 minutes. The times listed indicate the amount of time that the silicon sample is subjected to the listed temperature. One particular embodiment of the invention includes annealing the sample at 1100° C. for 75 minutes.

Figure 4:
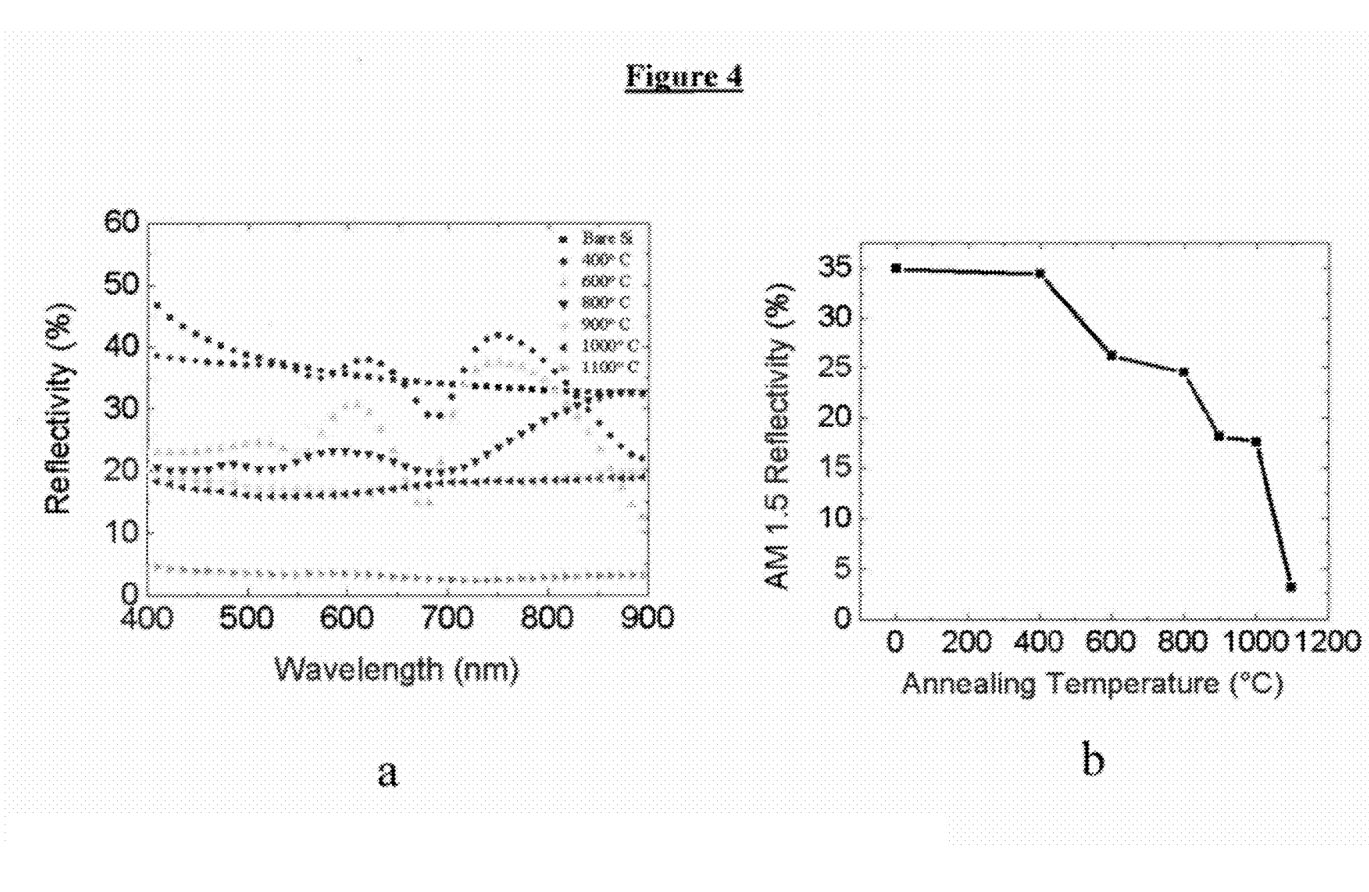
FIG. 4 depicts light reflection from the Si samples co-implanted with H and Ar ions. 4a: Reflectivity as a function of light wavelength for different annealing temperatures. Included also is the reflectivity for a polished virgin Si sample; 4b: Total reflectance under the AM1.5 sunlight condition as a function of annealing temperature.

Previous studies on co-implantation of H with He or B, where the co-implantation of these light ions is unlikely to cause amorphization of Si, have not led to the peculiar Si surface morphology observed in our case. This further emphasizes the important role of the a-Si layer in the formation of high-density and high-aspect-ratio surface texture structures required for effective suppression of light reflection. At low annealing temperatures (<900° C.), the reflectivity spectra for normal incidence (FIG. 4a) display oscillatory features, which may result from optical interference effects associated with the amorphous-crystalline layer structure. From the reflectivity spectra, the reflection of the standard air mass 1.5 (AM1.5) sunlight can be determined by weighing the photon flux over the corresponding solar spectrum (FIG. 4b). As suggested by RBS/C data, the thickness of the a-Si layer decreases significantly after annealing at 900° C., thus reducing the interference effect. In the meantime, light reflection is decreased by a factor of about 2 compared to the unprocessed polished Si, consistent with the appearance of a high density of craters on the surface Annealing of Ar co-implanted Si at about 1100° C. or greater causes a dramatic reduction in light reflection, for example, being less than 5% over a wide range of the solar spectrum. The diffuse reflection loss of this sample remains below 5%, only slightly greater than that of the polished virgin Si (~1-2%; data not shown). Therefore the actual light transmittance is expected to exceed at least about 90%, and may be at least about 95%, in the sample.

In some embodiments of the invention, the annealing occurs in an oxidizing atmosphere. An oxidizing atmosphere includes any condition under which oxidation of the substrate occurs. The oxidizing atmosphere includes oxidizing species such as atomic oxygen, molecular oxygen, or oxygen ions, but there are no particular limitations to the oxidizing species included in the oxidizing atmosphere as long as the seed oxidizes the silicon sample. For instance, a dry oxygen [O] atmosphere may be utilized.

Figure 5:
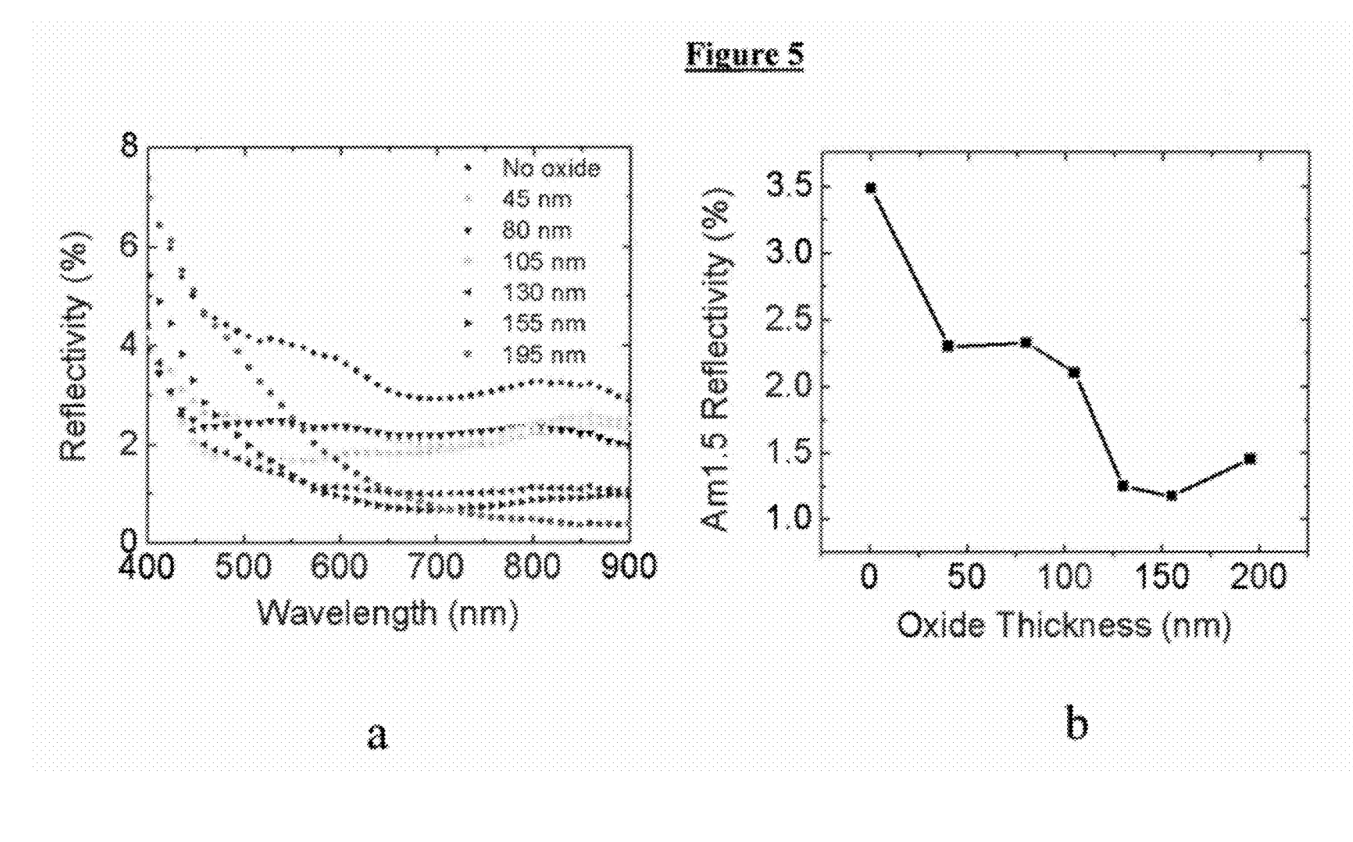
FIG. 5 illustrates light reflection from the Si samples co-implanted with H and Ar ions. 5a. Reflectance spectra for the 1100° C. annealed sample grown with an oxide layer of various thickness; 5b. Total reflection under the AM1.5 sunlight condition as a function of the surface oxide thickness for the 1100° C. annealed sample.
Figure 6:
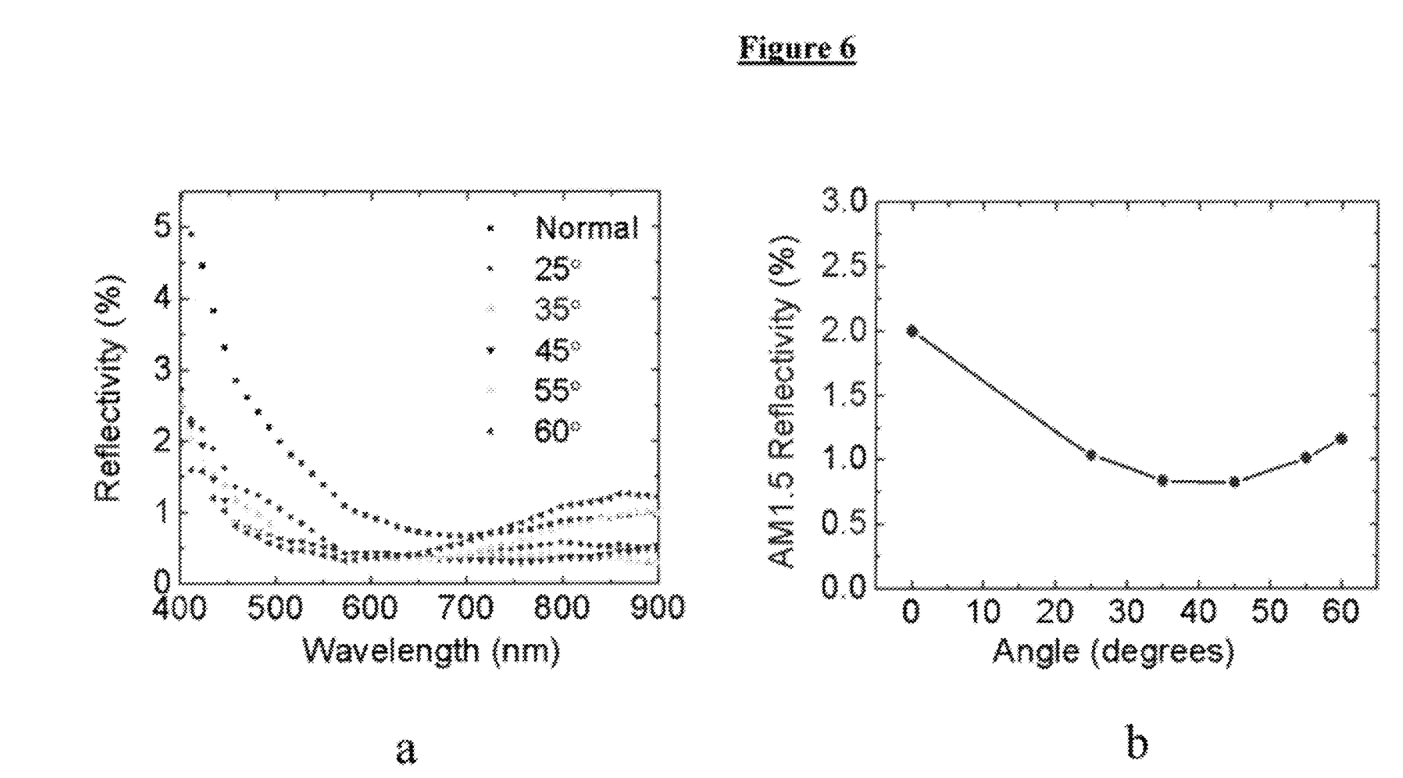
FIG. 6 depicts light reflection from the Si samples co-implanted with H and Ar ions. 6a. Reflectance spectra under different incident angles for the 1100° C. annealed sample grown with a 155-nm oxide layer; 6b. The total reflection under the AM1.5 sunlight condition as a function of incident angles for the 1100° C. annealed sample grown with a 155-nm oxide.

Therefore, the reflectivity of the sample can be further reduced, in one aspect of the invention, by annealing it in an oxidizing atmosphere to produce a thin surface oxide layer. This surface oxide layer also may serve to passivate surface defects. In some embodiments of the invention, the oxide layer may have a thickness of up to 300 nm. In some embodiments of the invention, the oxide layer may have a thickness between 1 and 200 nm. In other embodiments of the invention, the oxide layer may have a thickness between 40 and 200 nm. In other embodiments of the invention, the oxide layer may have a thickness between 45 and 155 nm. This oxide layer may serve-as a graded index layer between the air and Si (FIGS. 5a and 5b). With an oxide layer, the total AM1.5 reflectance decreases with increasing surface oxide thickness up to about 155 nm, and it also maintains at a low level for a wide range of incident angles at this thickness (FIGS. 6a and 6b). For the greater oxide thickness (e.g., about 195 nm), the optical interference effects associated with the surface oxide layer may cause a slight increase of the reflectivity in the visible range and a decrease in the near-infrared spectrum. In one embodiment of the invention, the 155-nm surface oxide yields the lowest reflectance of AM1.5 sunlight, for example, about 2% at normal incidence and less than about 1% at large angles of incidence (FIG. 5b). This is comparable to and even exceeds the best records in Si antireflection achieved with other methods.

Figure 7:
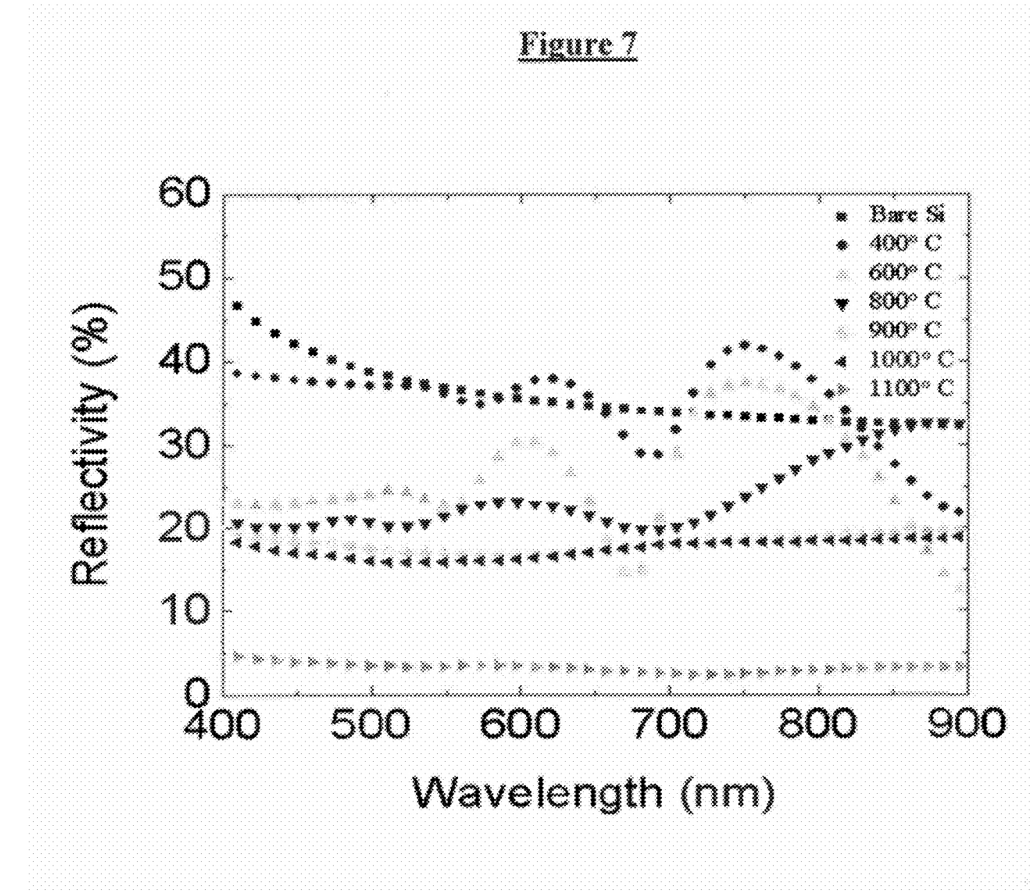
FIG. 7 shows reflectivity measurements over a broad range of wavelengths at normal incidence for embodiments of the invention annealed at different temperatures.

FIG. 7 demonstrates the difference in reflectivity (broadband reflectance at normal incidence) for embodiments of the invention that have been annealed at various temperatures. The industry standard is approximately 25% absolute reflection. Samples annealed at 800° C. to 1100° C. under conditions described in the invention improve upon this standard, with an example of <5% broadband reflectance at 1100° C. In some embodiments of the invention, the textured crystalline silicon surface has a light transmittance greater than 90% for wavelengths between and including 400 and 900 nm under the AM1.5 sunlight condition. In other embodiments, the textured silicon surface has a light transmittance greater than 95% under the AM1.5 sunlight condition. In some embodiments of the invention, the textured crystalline silicon surface has a light transmittance greater than 95% for a broad range of light incident angles from 0 to 85° with respect to the surface normal.

The lowest reflectance achieved by methods of the invention over the AM1.5 solar spectrum is about 1%, though reflectance of less than about 3%, or less than about 5%, or less than about 10%, or less than about 20%, or less than about 30%, or less than about 40% can be provided according to aspects of the invention, for example, for a wide range of incident angles.

The fabrication of a complete solar cell module involves several key steps including doping, antireflection, metallization, etc. The invention described herein addresses the use of ion implantation for achieving antireflection of silicon. It is important to note that this is fundamentally different from doping via ion implantation, whereby dopant ions, limited only to group-III elements such as boron for p-type doping and group-V elements such as phosphorus for n-type doping, are implanted in silicon. The ion species (hydrogen, argon, etc.) utilized in this invention do not encompass any dopants, and the implantation parameters (the range for ion dose and energy) differ greatly from those used for doping. In the end, the effects of these implanted ion species on silicon crystals are also completely different from those created by dopants. For example, no surface texture structures as seen in this invention can be realized simply by ion implantation doping.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

We claim:

1. A method for producing a textured crystalline silicon surface, said method comprising:
   providing a crystalline silicon substrate;
   implanting said silicon substrate with hydrogen ions by ion implantation;
   implanting said silicon substrate with heavy ions by ion implantation, wherein said heavy ions are selected from argon, krypton, xenon, silicon and germanium ions; and
   annealing said implanted silicon, wherein said annealing occurs at a temperature between and including 800° C. and 1200° C. for 60 to 90 minutes, inclusive,
   wherein said ion implantations are conducted under conditions such that the depth of implantation from the textured crystalline silicon surface for said heavy ions is less than or equal to half of that for said hydrogen ions.

2. The method according to claim 1, wherein said annealing occurs at a temperature between and including 1050° C. and 1150° C.

3. The method according to claim 1, wherein said annealing occurs at said temperature for about 75 minutes.

4. The method according to claim 1, wherein said annealing occurs in an oxidizing atmosphere.

5. The method according to claim 1, wherein said method further includes adding a cathode and an anode to said a textured crystalline silicon surface to produce a solar cell.

* * * * *